United States Patent
Asaumi et al.

[11] Patent Number: 5,867,055
[45] Date of Patent: Feb. 2, 1999

[54] SEMICONDUCTOR DEVICE CONTAINING AN ADJUSTABLE VOLTAGE GENERATOR

[75] Inventors: Masaji Asaumi, Kyoto; Yuji Matsuda, Takatsuki, both of Japan

[73] Assignee: Matsushita Electronics Corporation, Osaka, Japan

[21] Appl. No.: 658,005

[22] Filed: Jun. 4, 1996

[51] Int. Cl.$^6$ .................................................. H01H 37/76
[52] U.S. Cl. ..................... 327/525; 327/545; 257/223; 257/230; 257/445; 348/298; 348/299
[58] Field of Search ................................. 327/525, 530, 327/538, 545, 536; 257/223, 230, 292, 445; 348/298, 299

[56] References Cited

U.S. PATENT DOCUMENTS

| | | | |
|---|---|---|---|
| 5,202,575 | 4/1993 | Sakai ........................................ | 257/292 |
| 5,386,115 | 1/1995 | Freidhoff et al. ....................... | 250/281 |
| 5,499,183 | 3/1996 | Kobatake ................................ | 327/536 |
| 5,525,813 | 6/1996 | Miyake et al. ........................... | 257/59 |

FOREIGN PATENT DOCUMENTS 06153079A 5/1994 Japan .

Primary Examiner—Kenneth B. Wells
Attorney, Agent, or Firm—Morrison & Foerster LLP

[57] ABSTRACT

A semiconductor device and a method of inspecting the same are described. The semiconductor device does not need voltage adjustment of an external driver circuit, since it contains a voltage generator to inspect and memorize the best value of voltage by controlling from outside. The voltage generator has a plurality of capacitors whose electrodes of one side are connected to a common node, a potential changing circuit to change the potential to which the other electrodes of these capacitors are connected respectively, and a buffer amplifier whose input power is the voltage generated in the common node. The output power of the buffer amplifier is connected to a semiconductor integrated circuit. The potential changing circuit is provided to change the potential to which the electrode of each capacitor is connected to a source potential or to a ground potential depending on the connection of the fuse connected between the source and each of the capacitors.

16 Claims, 7 Drawing Sheets

Blooming Control Electrode

/ 5,867,055 /

SEMICONDUCTOR DEVICE CONTAINING AN ADJUSTABLE VOLTAGE GENERATOR

FIELD OF THE INVENTION

This invention relates to a semiconductor device containing an adjustable voltage generator and method of checking the same.

BACKGROUND OF THE INVENTION

Some semiconductor devices need to adjust the voltage which is supplied from external sources. A solid state imaging device is taken as an example to explain such conventional techniques.

FIG. 5A shows the structure of the conventional solid state imaging device. Photo diodes 1 arranged two-dimensionally are connected to vertical charge coupled devices (CCDs) 2 in every line. The vertical CCDs 2 are connected to a horizontal CCD 3. The horizontal CCD 3 is connected to an output amplifier 4 for charge-detection. The signal charge generated by being converted photoelectrically in the photo diodes 1 is transmitted to the vertical CCDs 2 and then to the horizontal CCD 3, and outputted after being converted to a voltage by the output amplifier 4. A solid state imaging device having this structure contains two portions where the driver voltage should be adjusted. The examples are a blooming control voltage and a reset voltage of a charge-detector of the output amplifier 4.

The following is an explanation about the blooming voltage. When a strong light beam enters, signal electrons generated at the photo diodes overflow and flow into the adjacent photo diodes or the vertical CCDs. This phenomenon is called blooming. A vertical overflow drain or a horizontal overflow drain is used in order to control this blooming. The vertical overflow drain has a structure to discharge the signal electrons to the substrate before the electrons flow into the adjacent photo diodes or the vertical CCDs, while the horizontal overflow drain has a structure to discharge the signal electrons to the drain before they flow into the adjacent photo diodes or the vertical CCDs by providing an exclusive drain and a control electrode.

The vertical overflow drain is briefly explained below. FIG. 5B is a cross-sectional view of a photo diode and an adjacent vertical CCD of the vertical overflow drain, which is taken in line of A-A' of FIG. 5A. FIG. 5C is a graph to show a potential along the line of B-B'-B" of FIG. 5B. Signal electrons 15 are stored at the photo diode 7 in proportion to the amount of incident light. As shown in the potential 12, the signal electrons 15 stored at the photo diode 7 partially flow into the vertical CCD 10 if the potential of the p type area 6 is lower than the barrier potential (9 and 6 of the FIG. 5C) between the photo diode 7 and the vertical CCD 10. As shown in the potential 14, the potential of the p type area 6 is raised and the signal electrons 15 are discharged to the substrate before the electrons 15 are overflowed to the vertical CCD 10 if the voltage 16 applied to the silicon substrate 5 is increased. As mentioned above, the blooming control capability is improved as the voltage 16 to be applied to the substrate 5 is raised, however, the amount of the signal electrons 15 stored at the diode 7 (e.g. saturation signal) is reduced. Therefore, the potential 13 shown in FIG. 5C is the best voltage to obtain the largest saturation signal (storage) while controlling the blooming. In FIG. 5B, 8 and 9 are p type areas and 11 is an electrode.

The conventional semiconductor devices, however, have some problems as follows.

First, the best voltage for every chip varies due to several reasons like the variation of the manufacturing process when the best voltage is applied to the substrate or the control electrode. Thus, it is necessary to adjust the voltage in the external circuit, e.g. the blooming control in the above-mentioned solid state imaging device. In addition to that, the information of the obtained best voltage cannot be maintained inside the semiconductor device though the best voltage can be detected by varying the voltage applied from the outside, according to the conventional method of inspecting a semiconductor device.

SUMMARY OF THE INVENTION

This invention aims to provide a semiconductor device which does not need adjustment of voltage at an external driver circuit, and method of inspecting the same. In order to achieve such aims, the semiconductor device of this invention contains a voltage generator in order to detect and memorize the best voltage due to an external control.

The semiconductor device of this invention comprises a semiconductor integrated circuit and a voltage generator to operate the circuit both of which are formed on a substrate. The voltage generator has plural capacitors whose electrodes of one side are connected to a common node, a means to change potential of these capacitors respectively to which the other electrodes of these capacitors are connected, and a buffer amplifier whose input power is the voltage from the common node. The output of the buffer amplifier is connected to the semiconductor integrated circuit.

According to the structure, the voltage necessary to operate the semiconductor device is generated inside the semiconductor device, and the voltage can be adjusted by the potential changing means. Thus it is not necessary to adjust the voltage at an external circuit. In other words, the voltage obtained at the common node of plural capacitors varies from source potential to ground potential by changing the connection of the plural capacitors respectively, for example, switching to be a source potential or to be a ground potential.

The semiconductor integrated circuit may be, for example, a circuit of a solid state imaging device which has a photoelectric converter to store the signal charge and an adjacent means to discharge excess charge. The output of the buffer amplifier is connected to the means for discharging excess charge via the diode. In this structure, a pulse voltage is applied from outside while a direct current is applied to the means for discharging excess charge, and the driving is called an electron shutter driving.

Alternatively, the semiconductor integrated circuit may be a circuit of a solid state imaging device having a signal detecting means and a means to reset the potential, and the output of the buffer amplifier is connected to the reset means via the diodes. According to the structure, a normal reset operation is conducted, namely, a pulse voltage is applied from the outside while a direct current is regularly applied to the reset means.

It is preferable that the capacitance of these capacitors is $1:2:4: \ldots 2^{n-1}$ where n is the number of the capacitors. If the connection of every capacitor is changed to a source potential or to a ground potential, $2^n$ kinds of voltages can be obtained in the steps where the voltage between the source and the ground is divided into $2^{(n-1)}$ equal parts.

It is further preferable that the capacitance of the n capacitors is $1:2:4: \ldots :2^{n-1}$ where the number of the capacitors is expressed as n+2m, while m kinds of capacitance is $1:2:4: \ldots :2^{m-1}$ where "2m capacitors" means two sets of capacitors of m kinds of capacitance. In this case, the voltage which is already selected from the $2^n$ kinds of voltages can be finely adjusted in the voltage steps where the voltage between the source and the ground is divided $2^{n-1}+2^m$ equal parts.

It is also preferable that the potential to which the electrode of every capacitor is connected by the on-off states of fuse, depending on the condition of the fuse (connected or cut), so that the potential changing can be conducted in a simple and certain manner. More specifically, the potential changing means can be constructed by using fuses and resistors. For instance, the electrode of each capacitor may be connected to the source via the fuse, and to the ground via the resistors. A transistor can be substituted for the resistor. In this case, a transistor of depression type should be used to equalize the gate potential and the source potential, so that a stabilized operation is obtained since the relatively low resistance of the on-state of the transistor can be utilized. The same effect will be obtained if an enhancement type transistor is used to set the gate potential higher than the source potential by a predetermined voltage.

The capacitors comprise a pair of electrode layers. It is preferable that the electrode layer which is located closer to the substrate is connected to the predetermined potential via the potential changing means. In other words, the other electrode is connected to the common node. According to this structure, the parasitic capacitance generated between the substrate and the electrode can be controlled.

Next, the method of inspecting the semiconductor device of this invention comprises the following steps:

changing the potential to which the electrodes of the plural capacitors are connected according to the binary code provided from an external source;

varying gradually the output voltage from the buffer amplifier by varying the binary code successively;

memorizing the binary code where the output voltage is the best; and controlling the potential changing means so that the best value of the output voltage is constantly obtained, based on the memorized binary code.

According to the inspecting method, the voltage adjustment of the voltage generator contained in the semiconductor device and writing by controlling the potential changing means can be conducted successively and directly. In this case, the potential changing means may be controlled by providing a binary code which is identical to that of the best value of the output voltage or a binary code of the complement (the complement of one) depending on the structure of the voltage generator contained in the semiconductor device. As a result, the best voltage can be easily written.

Moreover, a precise voltage is set by writing the best voltage controlled by the potential changing means when the characteristics of the semiconductor circuit are evaluated.

DETAILED DESCRIPTION OF THE INVENTION

Embodiments of this invention are explained below referring to Examples 1 to 10.

EXAMPLE 1

Figure 1A:
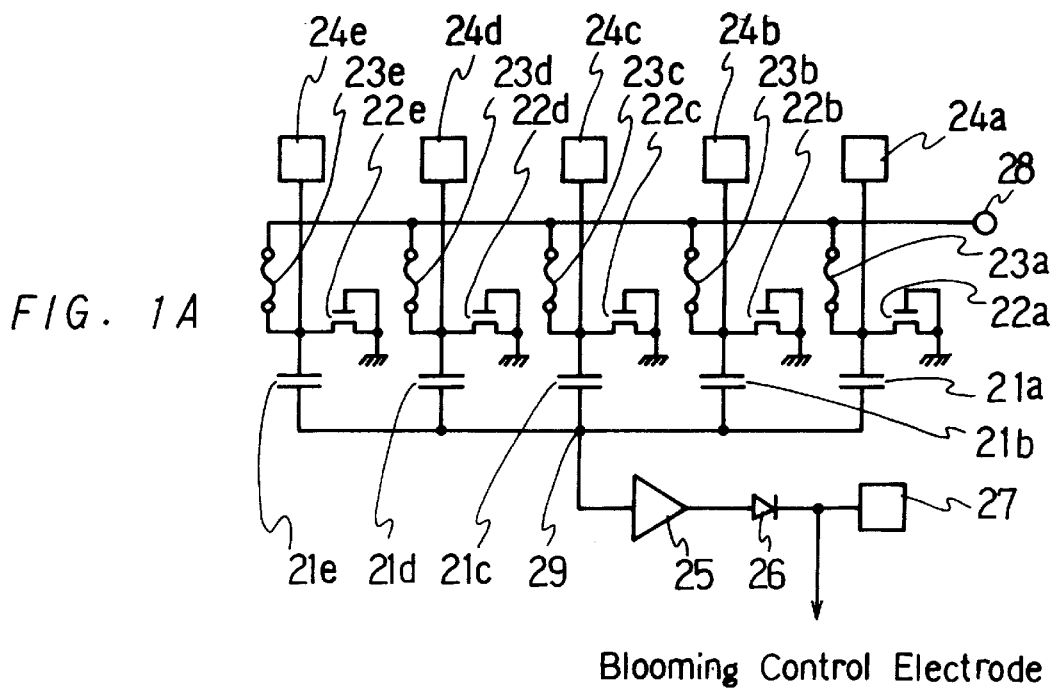
FIG. 1A is a circuit diagram of the voltage generator of the semiconductor device according to Example 1 of this invention.

FIG. 1A shows the circuit of this invention, which is used for a solid state imaging device. One electrode of capacitor 21a is connected to a common node 29 while the other electrode is connected to a ground via a transistor 22a, to a source terminal 28 via a fuse 23a, and to a pad 24a, so that a basic circuit is composed. Such basic circuits of n numbers are connected in parallel, and the common node 29 is inputted to a buffer amplifier 25. The output is connected to a voltage node of an integrated circuit. In the case of a solid state imaging device, the input voltage node is a blooming control electrode of e.g. a semiconductor substrate. The input voltage node is connected to a pad 27 via diodes. In the example shown in FIG. 1A, n=5. In this example, the capacitance (Ca–Ce) of capacitors (21a–21e) is set to meet the requirement of the following equation.

$$16Ca=8Cb=4Cc=2Cd=Ce \quad (1)$$

The operation of the basic circuit comprising the capacitor 21a, the transistor 22a, the fuse 23a, and the pad 24a is explained below. When the fuse 23a is connected, a circuit is formed from the source 28 to the ground via the fuse 23a and the transistor 22a. The transistor 22a is off at this time, thus the resistance between the drain and the source is as high as several MΩ. Since the fuse 23a is several hundreds Ω, the potential of the pad-side electrode of the capacitor 21a is substantially the same as that of the source 28.

If the fuse 23a is cut off, this circuit is completely disconnected from the source. Therefore, the potential of the pad-side electrode of the capacitor 21a becomes a ground potential via the high resistance between the drain and the source of-the transistor 22a. Namely, the potential of the pad-side electrode of the capacitor 21a can be set to be a source potential or to be a ground potential, according to the connection of the fuse.

Figure 1B:
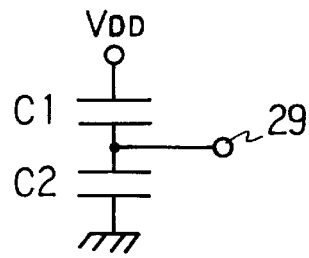
FIG. 1B shows an equivalent circuit of the voltage generator.

FIG. 1B shows an equivalent circuit of a voltage generator in which five basic circuits mentioned above are connected in parallel. In this drawing, the capacitance C1 of the source-side corresponds to the composite value of any capacitors (21a–21e) of the basic circuits in FIG. 1A if the fuse is still connected. On the other hand, the capacitance of the ground-side (C2) corresponds to the composite capacitance of the capacitors to which the fuse is not connected. At that time, voltage Vo is generated in the common node 29, and the voltage is described as follows.

$$Vo = VDD \times C1/(C1+C2) \quad (2)$$

As the composite value of C1 and C2 is the total composite value of the capacitors (21a–21e), it can be expressed as follows.

$$C1+C2 = Ca+Cb+Cc+Cd+Ce \quad (3)$$

If the relationship shown in Equation (1) is substituted, Equation (2) is described as follows.

$$Vo = VDD \times C1/31Ca \quad (4)$$

In other words, voltage Vo in proportion to the capacitance C1 of the source-side is obtained. Thus, desirable voltage can be generated in the steps where the source voltage is divided into thirty-one equal parts, by selectively cutting the fuses (23a to 23e). The voltage generated in this manner becomes a low impedance by the buffer amplifier 25 and is applied to the blooming control electrode via the diode 26.

Figure 1C:
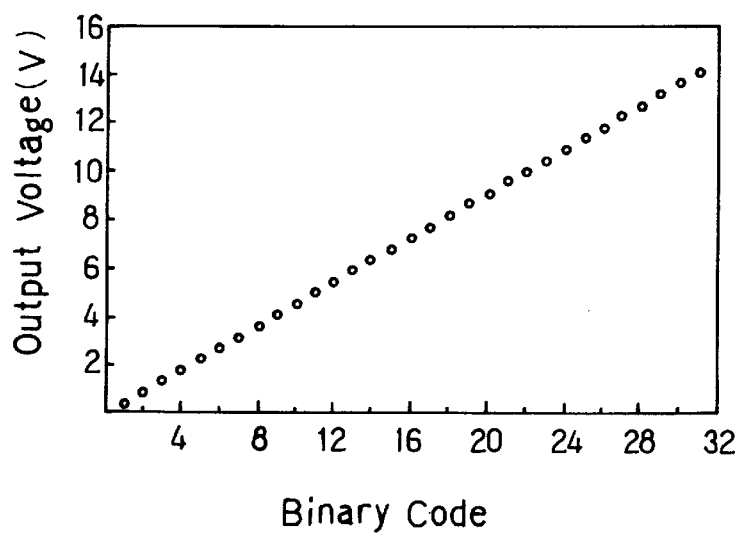
FIG. 1C is a graph showing the relationship between the binary code which is provided to the voltage generator and the output voltage.

FIG. 1C is a graph showing the voltage outputted to the pad 27 when the fuses (23a–23e) are selectively cut in the solid state imaging device comprising the circuit shown in FIG. 1A. In the lateral axis, the numbers from 0 to 32 indicate the condition of the fuses (23a–23e) with the decimal system. And the numbers correspond to the binary code '00000'~'11111' in which the connecting condition of each fuse is "1", and the cut-off condition is "0". The fuse 23a is LSB (Least Significant Bit), and 23e is MSB (Most Significant Bit). The measurement was conducted at the source voltage of 15V.

Next, the method of inspecting the semiconductor device according to this invention is as follows.

In the solid state imaging device shown in FIG. 1A, a probe is contacted with the pads (24a–24e). Then, the potential corresponding to the binary codes from '00000' to '11111' are applied by turns. In the binary codes, the source potential is "1", and the ground potential is "0". The pad 24a is LSB and the pad 24e is MSB. During the operation, the source 28 is open.

When the source potential is provided to the pads, the condition becomes equivalent to that where the power is connected to the source terminal 28 and the fuses are connected. When the ground potential is provided to the pads, the condition is equal to that where the fuses are cut. Namely, the potential of the blooming control electrode can be varied without cutting the fuses. As a result, the best potential of the blooming control electrode can be determined by varying the binary code while monitoring the characteristics of the imaging element.

In the next step, another code (complement) in which "0" and "1" of the binary code at the best potential are exchanged is generated, and the fuses are cut by raising the voltage provided from the probe, thereby the best voltage is written in the semiconductor device. According to these operations, the detection and writing of the best voltage can be carried out efficiently and directly.

EXAMPLE 2

Figure 2:
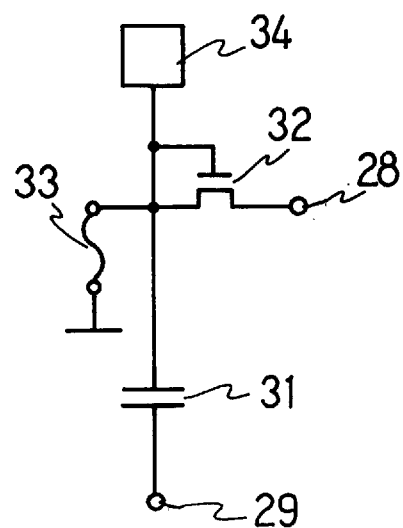
FIG. 2 shows the basic circuit of the voltage generator of the semiconductor device according to Example 2 of this invention.

Example 2 of this invention is explained below. This is also applied to the solid state imaging device of Example 1. The basic circuit of the voltage generator is shown in FIG. 2. The basic circuit of Example 2 differs from that of Example 1 in the two viewpoints: the fuse 33 is connected between a capacitor and the ground; and the drain of the transistor 32 is connected to the source 28. In the drawing, 34 is a pad. The operation of this basic circuit is the same as that of Example 1 though the pad-side electrode of the capacitor 31 is the ground potential when the fuse 33 is connected. The same electrode becomes the same potential as the source 28 when the fuse 33 is cut off.

If n numbers of the basic circuits are connected in parallel and the capacitance of each basic circuit is determined to be twice, four times . . . $2^{n-1}$ times, a desired voltage from the ground potential to the source potential can be obtained as done in Example 1.

This semiconductor device can be inspected in accordance with Example 1. However, the electrode potential set by the connection/cutting of the fuse is inversely related to Example 1, thus, the binary code provided to detect the best potential and the binary code for fuse cutting accord with each other.

EXAMPLE 3

Figure 3A:
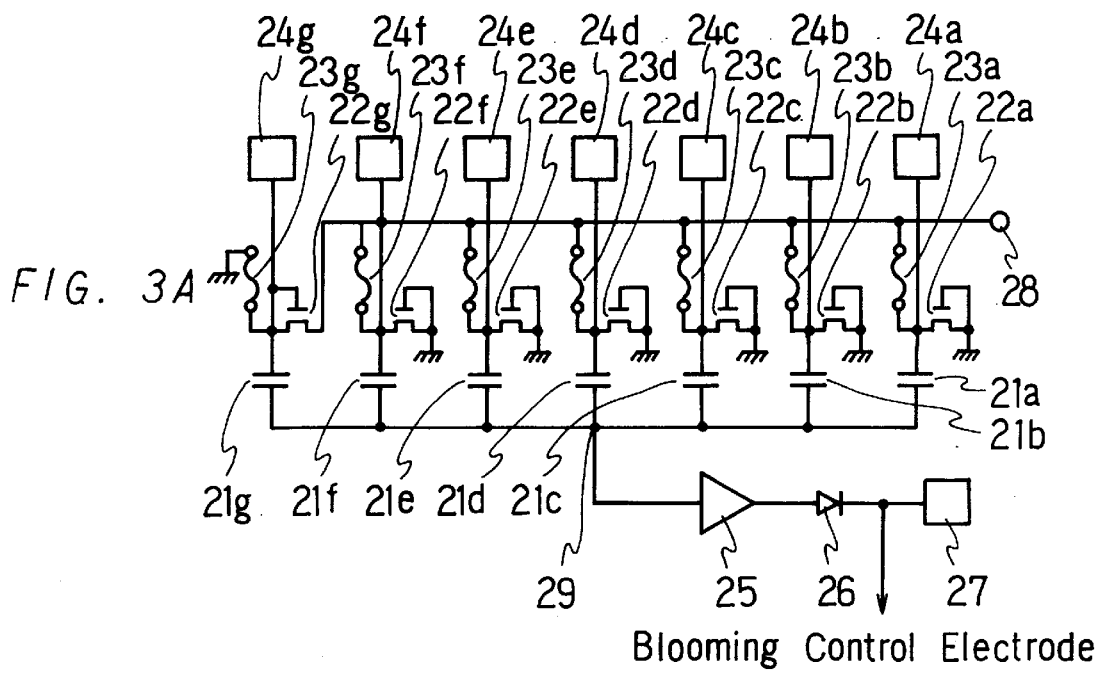
FIG. 3A is a circuit diagram of the voltage generator of the semiconductor device according to Example 3 of this invention.

FIG. 3A is a circuit diagram of Example 3 of this invention. The circuit of Example 3A is distinguished from that of Example 1 shown in FIG. 1A in that the number of basic circuits increases from five to seven, and one of them has the structure shown in Example 2. The capacitance (Cf) of the capacitor (21f) is equal to the capacitance (Cg) of the capacitor (21g). Though there is not a direct relation with the capacitance of the other five capacitors (21a–21e), Cf is defined to be equal to Cg and also equal to Ca for the sake of convenience. The function of the capacitors (21a–21e) is the same as Example 1, namely the best value of the blooming control voltage is determined by the capacitors (21a–21e).

Figure 3B:
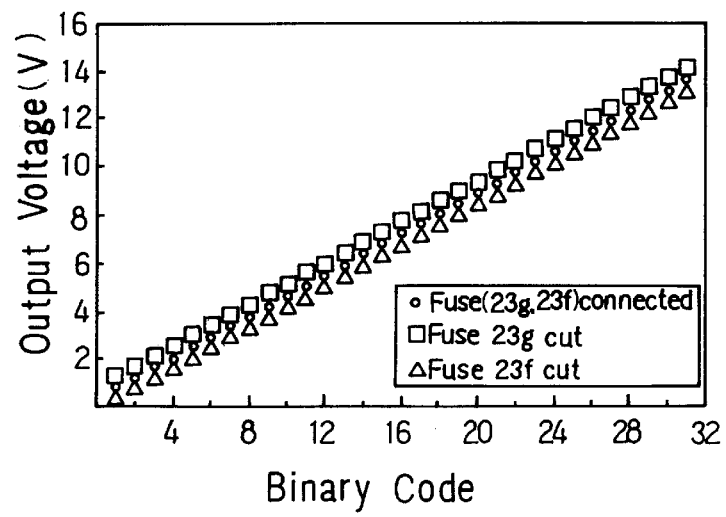
FIG. 3B is a graph showing the relationship between the binary code which is provided to the voltage generator and the output voltage.

This best value of the output voltage varies depending on the voltage of the source 28. In the circuit shown in FIG. 1A, it is impossible to alter the blooming control voltage after the voltage is determined by the selective cutting of fuses (23a–23e). The two basic circuits added in FIG. 3A enable a fine adjustment of the output voltage in this case. In other words, the capacitor 21f is added to the ground-side capacitor C2 by cutting the fuse 23f, while the capacitor 21g is added to the electrode-side capacitor C1 by cutting the fuse 23g. Therefore, the voltage set in the capacitors (21a–21e) can be finely adjusted in the range of ±VDD/33. FIG. 3B shows the output voltage obtained by the fine adjustment in addition to the output voltage shown in FIG. 1A.

EXAMPLE 4

Figure 4:
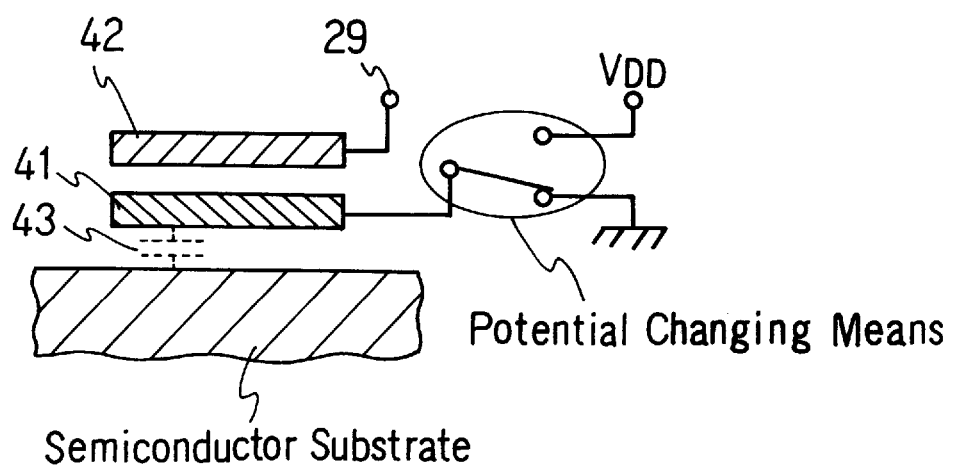
FIG. 4 shows the structure of the electrode of the voltage generator of the semiconductor device according to Example 4 of this invention.
Figure 5A:
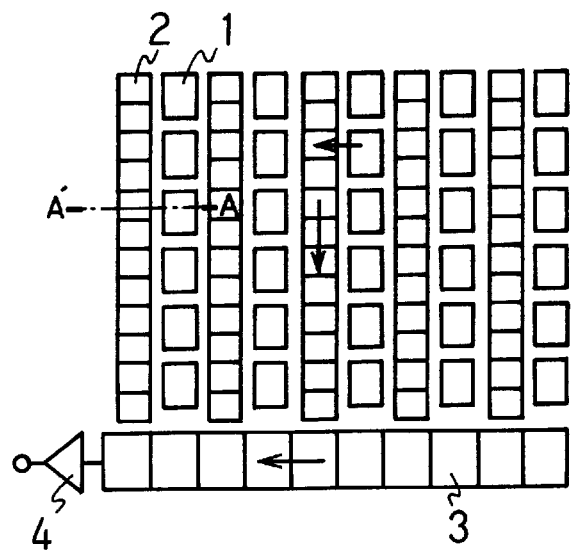
FIG. 5A is a plan view showing the structure of a solid state imaging device.
Figure 5B:
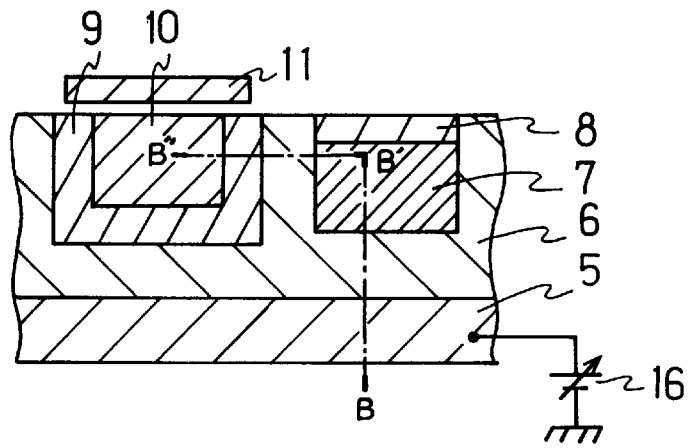
FIG. 5B is a cross-sectional view of FIG. 5A.
Figure 5C:
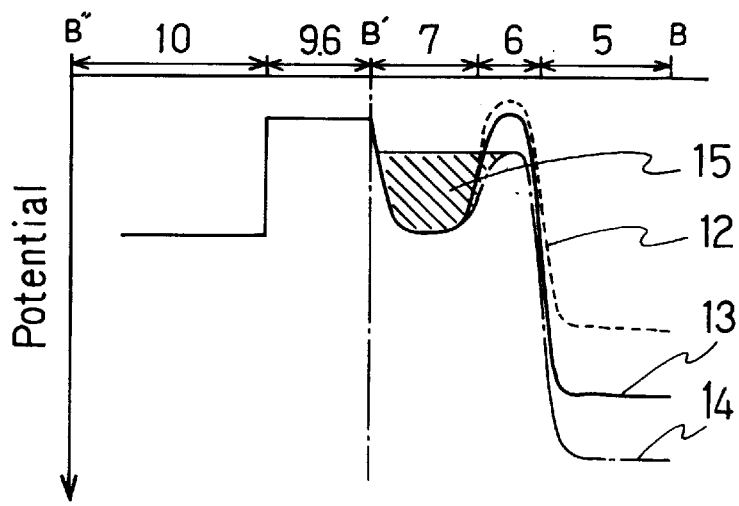
FIG. 5C is an explanatory view showing the potential of the picture element of the solid state imaging device.

The structure of the semiconductor device of Example 4 of this invention is explained below. As shown in FIG. 4, the capacitor is composed of two electrode layers. The first layer electrode 41 changes the potential with a fuse, while the second layer electrode 42 is connected to the common node 29. As a result, the influence of the parasitic capacitor is decreased and the accuracy of the voltage generating circuit is improved. In other words, a large parasitic capacitor 43 exists between the first layer electrode 41 and the semiconductor substrate. In case this is connected to the node 29, the parasitic capacitor 43 joins the ground-side capacitor C2. As a result, the peak value in the range of the voltage adjustment is lowered. In order to avoid this problem, the first layer electrode 41 is made to be a potential changing electrode, so that the parasitic capacitor 43 does not influence on the output voltage even if this electrode is a source voltage or a ground voltage.

As mentioned above, the influence of the parasitic capacitor can be reduced and the range of the generating voltage can be expanded by making the first layer electrode adjacent to the semiconductor substrate to be an electrode changing the potential using the fuse, and by connecting the second layer electrode to the node 29.

EXAMPLE 5

Figure 6:
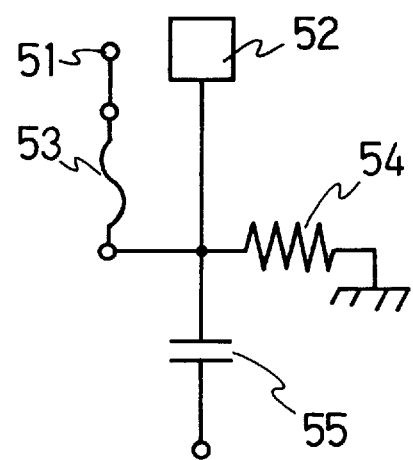
FIG. 6 shows the basic circuit of the voltage generator of the semiconductor device according to Example 5 of this invention.

FIG. 6 is a diagram of a basic circuit of Example 5 of this invention. In this drawing, 51 is a source terminal. 52 is a pad, 53 is a fuse. 54 is a resistor and 55 is a capacitor. In this basic circuit, similar to the circuit of Example 1, the pad-side electrode of the capacitor 55 becomes source potential when the fuse 53 is not cut, and the same electrode becomes the ground potential by cutting the fuse 53. This basic circuit differs from that of Example 1 in that a resistor 54 is substituted for the transistor 22a.

When the fuse 53 is not cut, the voltage of the pad-side electrode of the capacitor 55 is equal to the source voltage which is divided between the resistive component of the fuse 53 and the resistor 54. A greater resistance of the resistor 54 is preferred so that the voltage becomes closer to the source voltage, and the power consumption is reduced. When the fuse 53 is cut, pad-side electrode of the capacitor 55 is connected to the ground potential via the resistor 54.

EXAMPLE 6

Figure 7:
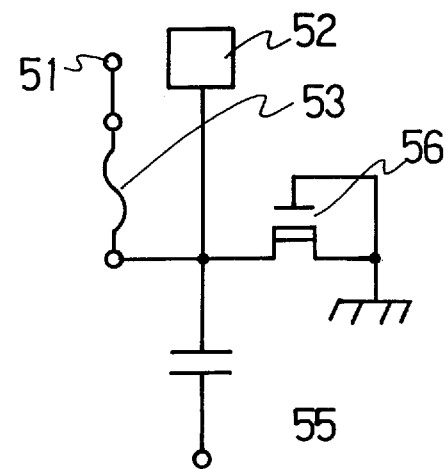
FIG. 7 shows the basic circuit of the voltage generator of the semiconductor device according to Example 6 of this invention.

FIG. 7 shows the basic circuit of the Example 6 of this invention. This basic circuit is distinguished from that of the basic circuit of Example 1 in that a depletion type transistor 56 is substituted for the transistor 22a of FIG. 1A.

When the fuse 53 is not cut, the transistor 56 is on and a circuit from the source 51 to the ground via the fuse 53 and via the transistor 56 is formed. The potential of the pad-side electrode of the capacitor 55 is lower than the source voltage by the difference of the lowered voltage set by the drain current and the resistive component of the fuse 53. The threshold voltage (VT) of the transistor 56 is preferably closer to zero so that this voltage becomes closer to the source voltage and less current is consumed.

When the fuse 53 is cut, the circuit is separated from the source. Since the transistor 56 is on, the drain potential is lower than the gate potential by the threshold voltage (VT). Namely, the potential of the pad-side electrode of the capacitor 55 is nearly the same as the ground potential. In the circuit of Example 1, the potential of the electrode might be unstable since it is connected to the ground potential via a high resistance when the transistor is off. In the circuit of Example 6, however, a stabilized operation is obtained since the transistor is always on.

EXAMPLE 7

Figure 8:
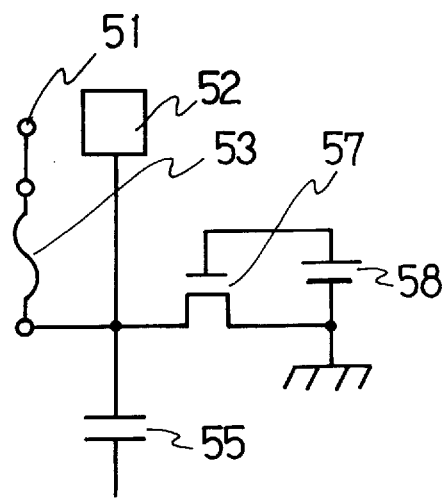
FIG. 8 shows the basic circuit of the voltage generator of the semiconductor device according to Example 7 of this invention.

FIG. 8 is the basic circuit of Example 7 of this invention. This circuit is distinguished from the basic circuit of Example 1 in that a source 58 applies forward voltage between the gate and the source of an enhancement type transistor 57. This circuit operates as the circuit of Example 6.

EXAMPLE 8

Figure 9:
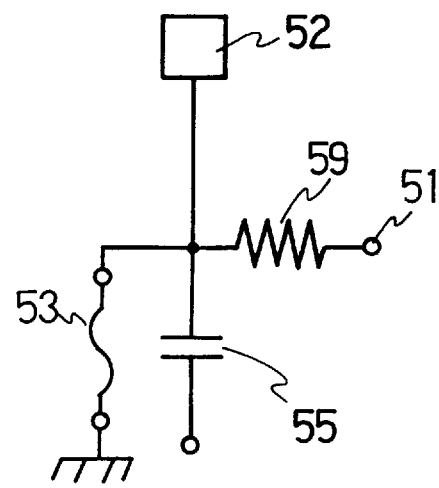
FIG. 9 shows the basic circuit of the voltage generator of the semiconductor device according to Example 8 of this invention.

FIG. 9 is the basic circuit of Example 8 of this invention. This circuit is identical to the basic circuit of Example 2 except that a resistor (59 in FIG. 9) is substituted for the transistor 32.

When the fuse 53 is not cut, the voltage of the pad-side electrode of the capacitor 55 is equal to the source voltage divided between the resistive component of the fuse 53 and the resistor 59. A greater resistance of the resistor 59 is preferred so that the voltage becomes closer to the source voltage and the power consumption is reduced. When the fuse 53 is cut, pad-side electrode of the capacitor 55 is connected to the source voltage via the resistor 59.

EXAMPLE 9

Figure 10:
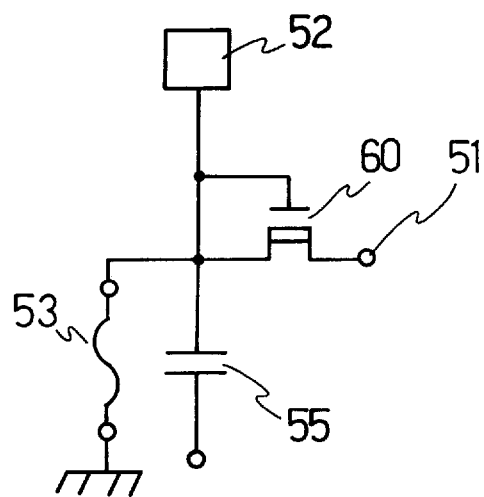
FIG. 10 shows the basic circuit of the voltage generator of the semiconductor device according to Example 9 of this invention.

FIG. 10 is the basic circuit of Example 9 of this invention. This circuit is identical to the basic circuit of Example 2 except that a depletion type transistor (60 in FIG. 10) is substituted for the transistor 32.

The operation of changing the voltage is substantially the same as that of the basic circuit of Example 2. However, the operation is more stable since the transistor 60 does the same operation as the depletion type transistor 56 of the circuit of Example 6.

EXAMPLE 10

Figure 11:
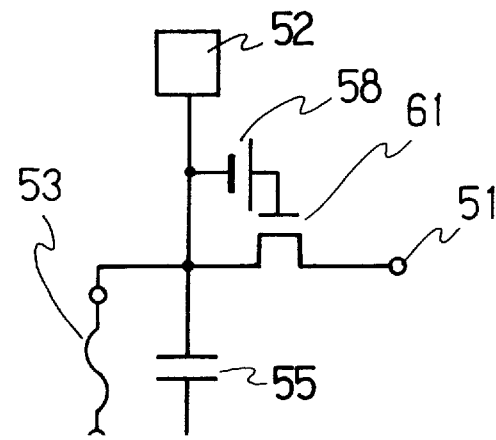
FIG. 11 shows the basic circuit of the voltage generator of the semiconductor device according to Example 10 of this invention.

FIG. 11 is the basic circuit of Example 10 of this invention. This basic circuit is identical to the basic circuit of Example 9 except that a enhancement type transistor 61 and a source 58 for applying forward voltage between the gate and the source are substituted for the depletion type transistor 60 of the circuit of Example 9. The operation is the same as the basic circuit of Example 9.

According to the semiconductor device of this invention, the voltage which is needed for the operation of the semiconductor integrated circuit is generated inside the semiconductor device, and the voltage can be adjusted by the potential changing means. Therefore, it is not necessary to adjust voltage in an external circuit. In addition, according to the method of inspecting the semiconductor device of this invention, the voltage adjustment of the voltage generator contained in the semiconductor device and the writing by controlling the potential changing means can be carried out successively and directly.

Although the above-mentioned examples concern the blooming control voltage in connection with a solid state imaging device, the same results and advantages can be obtained through application of the invention to adjustment of a reset voltage. Moreover, this invention can be applied to various semiconductor devices in addition to solid state imaging devices. Thus, the invention is not limited by or to the above described embodiments, but rather is limited only by the scope of the appended claims.

What is claimed is:

1. A semiconductor device comprising a semiconductor integrated circuit and a voltage generator both formed on a substrate, said voltage generator comprising: p1 a plurality of capacitors each having first and second electrodes, said first electrodes being connected to a common node;

potential adjusting means for adjusting a potential between a source potential of the semiconductor integrated circuit and a ground potential, said potential adjusting means being connected to said second electrodes; and a buffer amplifier, an input of which is connected to said common node;

wherein output of said buffer amplifier is connected to an input node of said semiconductor integrated circuit and wherein the ratio of capacitance of said plurality of capacitors is set to 1:2 when n equals 2 and $1:2: \ldots 2^{n-1}$ when n is 3 or more and n is the number of said plurality of capacitors.

2. The semiconductor device according to claim 1, wherein said semiconductor integrated circuit comprises a solid state imaging device having a signal detecting means and a potential reset means, wherein an output of said buffer amplifier is connected to said potential reset means.

3. The semiconductor device according to claim 1, wherein said potential adjusting means comprises a fuse and a transistor.

4. The semiconductor device according to claim 3, wherein said transistor is a depletion type transistor, and the gate potential of said transistor is equal to the source potential.

5. The semiconductor device according to claim 3, wherein said transistor is an enhancement type transistor, and the gate potential of said transistor is higher than the source potential by a predetermined voltage.

6. The semiconductor device according to claim 1, wherein at least one of said capacitors comprises a pair of electrode layers, and the electrode layer closer to the substrate is supplied with a predetermined potential via said potential adjusting means.

7. The semiconductor device according to claim 1, wherein said potential adjusting means adjusts the potential by cutting said fuse.

8. The semiconductor device according to claim 3, wherein said potential adjusting means adjusts the potential by cutting said fuse.

9. A method of inspecting a semiconductor device that comprises a semiconductor integrated circuit and a voltage generator both formed on a substrate, the voltage generator comprising a plurality of capacitors each having first and second electrodes, the first electrodes being connected to a common node; potential changing means for changing a potential applied to the second electrodes; and a buffer amplifier having an input which is connected to the common node, and an output connected to an input node of the semiconductor integrated circuit, the method comprising the steps of:

changing the potential according to a binary code provided from an external source;

varying the output voltage from the buffer amplifier by varying the binary code successively;

memorizing a first binary code corresponding to the output voltage; and controlling the potential changing means so that a constant output voltage is obtained based on the memorized first binary code.

10. The method of claim 9, wherein said potential changing means is controlled by the first binary code provided from an external source.

11. The method of claim 9, wherein said potential changing means is controlled by a second binary code that is the complement of the first binary code provided from an external source.

12. The method of claim 9, wherein said potential changing means is controlled while characteristics of said semiconductor device are being evaluated.

13. A semiconductor device, comprising a semiconductor integrated circuit and a voltage generator both formed on a substrate, said voltage generator comprising:

a plurality of capacitors each having first and second electrodes, said first electrodes being connected to a common node;

potential adjusting means for adjusting a potential between a source potential of the semiconductor integrated circuit and a ground potential, said potential adjusting means being connected to said second electrodes; and a buffer amplifier, an input of which is connected to said common node;

wherein an output of said buffer amplifier is connected to an input node of said semiconductor integrated circuit and wherein the number of said plurality of capacitors is n+2m, the ratio of capacitance of the n capacitors is set to 1:2 when n equals 2 and $1:2: \ldots 2^{n-1}$ when n is 3 or more while the ratio of capacitance of the m capacitors is set to 1:2 when m equals 2 and $1:2: \ldots 2^{m-1}$ when m is 3 or more.

14. A semiconductor device comprising a semiconductor integrated circuit and a voltage generator both formed on a substrate, said voltage generator comprising:

a plurality of capacitors each having first and second electrodes, said first electrodes being connected to a common node;

potential adjusting means for adjusting a potential between a source potential of the semiconductor integrated circuit and a ground potential, said potential adjusting means comprising a fuse and a resistor and being connected to said second electrodes; and a buffer amplifier, an input of which is connected to said common node;

wherein an output of said buffer amplifier is connected to an input node of said semiconductor integrated circuit.

15. A semiconductor device comprising a semiconductor integrated circuit and a voltage generator both formed on a substrate, said voltage generator comprising:

a plurality of capacitors each having first and second electrodes, said first electrodes being connected to a common node;

potential adjusting means for adjusting a potential between a source potential of the semiconductor integrated circuit and a ground potential, said potential adjusting means being connected to said second electrodes; and a buffer amplifier, an input of which is connected to said common node;

wherein said semiconductor integrated circuit comprises a solid state imaging device having a photoelectric converter to store signal charge and a discharging means to discharge excess charge adjacent to said photoelectric converter, an output of said buffer amplifier being connected to said discharging means and wherein the ratio of capacitance of said plurality of capacitors is set to 1:2 when n equals 2 and $1:2: \ldots 2^{n-1}$ when n is 3 or more and n is the number of said plurality of capacitors.

16. A semiconductor device comprising a semiconductor integrated circuit and a voltage generator both formed on a substrate, said voltage generator comprising:

a plurality of capacitors each having first and second electrodes, said first electrodes being connected to a common node;

potential adjusting means for adjusting a potential between a source potential of the semiconductor integrated circuit and a ground potential, said potential adjusting means comprising a fuse and a resistor and being connected to said second electrodes; and a buffer amplifier, an input of which is connected to said common node;

wherein said semiconductor integrated circuit comprises a solid state imaging device having a photoelectric converter to store signal charge and a discharging means to discharge excess charge adjacent to said photoelectric converter, an output of said buffer amplifier being connected to said discharging means.

* * * * *